United States Patent
Tiernan

(10) Patent No.: US 7,710,131 B1
(45) Date of Patent: May 4, 2010

(54) NON-CONTACT CIRCUIT ANALYZER

(75) Inventor: Tim Tiernan, Newton, MA (US)

(73) Assignee: Radiation Monitoring Devices, Inc., Watertown, MA (US)

( * ) Notice: Subject to any disclaimer, the term of this patent is extended or adjusted under 35 U.S.C. 154(b) by 0 days.

(21) Appl. No.: 11/840,957

(22) Filed: Aug. 18, 2007

(51) Int. Cl.
*G01R 31/302* (2006.01)
*G01R 31/28* (2006.01)

(52) U.S. Cl. ................. 324/750; 324/529; 324/530

(58) Field of Classification Search ............... None
See application file for complete search history.

(56) References Cited

U.S. PATENT DOCUMENTS

| | | | | |
|---|---|---|---|---|
| 3,543,299 A * | 11/1970 | Braun | ............... | 72/181 |
| 4,277,744 A * | 7/1981 | Audone et al. | ............... | 324/72 |
| 4,588,993 A * | 5/1986 | Babij et al. | ............... | 342/351 |
| 6,100,686 A * | 8/2000 | Van Delden et al. | ............... | 324/252 |
| 6,380,752 B1 * | 4/2002 | Irino | ............... | 324/755 |
| 6,456,070 B1 * | 9/2002 | Kazama et al. | ............... | 324/260 |
| 6,504,363 B1 * | 1/2003 | Dogaru et al. | ............... | 324/235 |
| 6,625,554 B2 * | 9/2003 | Suga et al. | ............... | 702/64 |
| 6,759,850 B2 * | 7/2004 | Harzanu et al. | ............... | 324/522 |
| 7,358,749 B2 * | 4/2008 | Kazama et al. | ............... | 324/750 |
| 2003/0029345 A1 * | 2/2003 | Tiernan et al. | ............... | 102/221 |

FOREIGN PATENT DOCUMENTS

| | | |
|---|---|---|
| EP | 1467218 A2 * | 10/2004 |
| JP | 2000206163 A * | 7/2000 |

* cited by examiner

*Primary Examiner*—Paresh Patel
(74) *Attorney, Agent, or Firm*—Townsend and Townsend and Crew LLP

(57) ABSTRACT

A non-contact circuit analyzer includes a computer system having a memory with circuit parameters stored therein wherein the circuit parameters specify acceptable operating characteristics for a circuit. The analyzer further includes a magnetic field detector coupled to the computer and configured to detect the magnetic field emitted from the circuit while operational. The magnetic field relates to current in the circuit. The analyzer further includes an electric field sensor coupled to the computer and configured to detect the electric field emitted from the circuit while operational. The electric field relates to voltage and/or operating frequency in the circuit. The magnetic field detector and the electric field detector are configured to send signals for the detected fields to the computer system. The computer system is configured to compare the signals to the circuit parameters to determine whether the circuit is operating within the circuit parameters.

22 Claims, 7 Drawing Sheets

NON-CONTACT CIRCUIT ANALYZER

BACKGROUND OF THE INVENTION

The present invention relates generally to circuit analysis, and more specifically relates to a system and method for non-contact detection of electric and magnetic fields generated by a circuit and interpreting the detected fields to analyze the circuit.

The testing and analysis of circuits, circuits boards and the like is a complex and a costly step in the manufacture of these devices. Moreover, the complexity and the cost of circuit test and analysis continues to rise as circuits are made smaller. The rise in complexity and cost of testing and analysis is attributable, at least in part, to the tester interfaces used to contact circuits for passing electrical test signals to the circuits and receiving response signals therefrom. Traditional tester interfaces include bed-of-nails interfaces, sockets, probe cards and the like. As the pitch of circuit interface contacts (e.g., contact pads, bonding pads, solder balls, solder mounds, leads, and the like) enter the sub-millimeter range, the micron range, and the sub-micron range, the pitch of adjacent tester contacts on tester interfaces similarly enter these ranges. The cost associated with the manufacture of such tester interfaces and the maintenance fees therefore, rise to relatively high levels yielding testing and analysis costly.

Testing and analysis of circuits and circuits boards is costly due not only to the relatively high cost for development and use of tester interfaces, but also because each unique circuit and/or unique circuit board is generally associated with a dedicated tester interface. Circuits and circuit boards that are manufactured in relatively low numbers present further testing problems in that the cost of a unique tester interface for such circuits can become relatively high for cost-effect testing. Further, circuits and circuit boards that were not designed for test, such as relatively older circuit boards, present additional unique testing problems, such as not being able to thoroughly test these boards because, for example, combinations of node that should be contacted for a thorough test may not be able to be contacted simultaneously. These older circuit boards might also be tested in relatively low numbers also raise cost-effective testing concerns.

Further, contact testing and analysis techniques often fail to expose flaws that lead to relatively early failure (often referred to as circuit infant mortality) of circuits and circuits boards. For example, contact testing is often of limited use to detect flaws in metal lines (e.g., cracks, missing material, etc), transistors (e.g., charge accumulation and associated uneven heating) and the like that often lead to relatively high infant mortality. Flaws that lead to high infant mortality are often detected through destructive techniques that ultimately render devices unsuitable for their intended use. Contact testing also provides limited testing for prognostic analysis of voltage, current, and circuit frequency of discrete internal components.

Therefore, new apparatus and methods are needed that provide for limited or no physical contact with circuits and circuit boards under test, have a relatively low dedication to specific circuits and/or circuits boards tested, and are configured to non-destructively detect flaws in the circuits and/or circuit boards.

BRIEF SUMMARY OF THE INVENTION

The present invention provides a circuit-analysis system and a circuit-analysis method. According to one embodiment of the present invention, a non-contact circuit analyzer includes a computer system having a memory with circuit parameters stored therein wherein the circuit parameters specify acceptable operating characteristics for a circuit. The analyzer further includes a magnetic field detector coupled to the computer and configured to detect the magnetic field emitted from the circuit while operational. The magnetic field relates to current in the circuit. The analyzer further includes an electric field sensor coupled to the computer and configured to detect the electric field emitted from the circuit while operational. The electric field relates to voltage and/or operating frequency in the circuit. The magnetic field detector and the electric field detector are configured to send signals for the detected fields to the computer system. The computer system is configured to compare the signals to the circuit parameters to determine whether the circuit is operating within the circuit parameters.

According to a specific embodiment, the electric field sensor includes at least one conductive member of a capacitive detector, and the circuit is another conductive member of the capacitive detector. According to another specific embodiment, the electric field detector and the magnetic field detector are a single detector, and may be a magnetoresistive sensor.

The computer system is configured to execute program code to operate the circuit in a known sequence of operations. The computer system is further configured to direct operation of the circuit based on the signals received from the electric and magnetic field detectors. The computer system is further configured to generate an IN curve for the circuit. The computer system is further configure to generate a map of the detected electric and/or magnetic fields.

The computer systems may also be configured to Fourier transform the signals received from the field sensor to separate the electric field information from the magnetic field information. The computer system may further be configured to i) identify a first set of harmonics associated with detected electric field spikes associated with voltage transitions in the circuit, ii) identify a second set of harmonics associated with a substantially square wave associated with the detected magnetic fields and the current in the circuit, and iii) determine whether the first set of harmonics are different from the second set of harmonics.

The electric field signals and the magnetic field signals may be identified by sampling the detected fields at different times during an operating cycle of the circuit.

According to another specific embodiment, the non-contact circuit analyzer further includes a conductive shield disposed between the field sensor and the circuit; and a switch configured to periodically ground the shield. The shield in a grounded state is configured to inhibit the circuit's electric field from reaching the field detector and permit the circuit's magnetic field to reach the field detector.

According to another specific embodiment, the non-contact analyzer of further includes a high permeability magnetic shield disposed between the circuit and the field detector, wherein the high permeability magnet shield is configured to shield external magnetic fields from reaching the field detector. The shield is physically moved into a position between the field detector the circuit and out from between the field detector and the circuit to calibrate the field detector for external magnetic fields.

According to another embodiment of the invention, a field detector includes a first plurality of layers of a circuit having a first flexibility; a second plurality of layers of the circuit having a second flexibility and coupled to the first plurality of layers; wherein i) the first and second plurality of layers are interleaved, ii) the first flexibility is greater than the second flexibility, and iii) at least two of the first plurality of layers are configured to form a channel having a width that substantially matches a width of a pin of a circuit to be tested. The field detector further includes at least a first magnetoresistive sensor coupled to an end of the first and second pluralities of layers.

According to a specific embodiment, the field detector further includes at least a second magnetoresistive sensor coupled to the end and disposed on an opposite side of the layers from the at least first magnetoresistive sensor. The at least first and the at least second magnetoresistive sensors are on opposite sides of the channel and are disposed approximately at an end of the channel. This configuration of the magnetoresistive sensors on opposite sides of the channels provides for differential measurements of the magnetic field generated by the circuit.

These and other advantages of the present invention will be understood from the following detailed description and the appended drawings.

DETAILED DESCRIPTION OF THE INVENTION

The present invention provides a circuit-analysis system and circuit-analysis method. More specifically, the present invention provides an electric and magnetic field detector or detector array for detecting electric and magnetic fields generated by a circuit and a computer method for analyzing the detected fields to analyze the circuit.

Figure 1A:
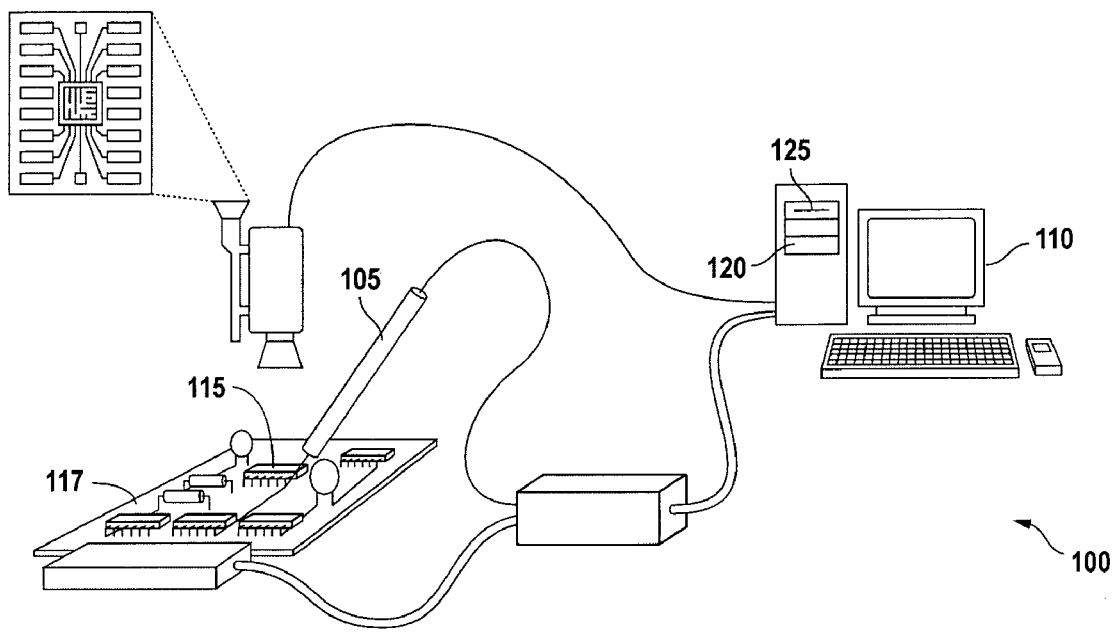
FIG. 1A is a simplified schematic of a circuit-analysis system according to one embodiment of the present invention.

FIG. 1A is a simplified schematic of a circuit-analysis system 100 according to one embodiment of the present invention. Circuit-analysis system 100 includes a field detector 105 coupled to a computing system 110. According to a specific embodiment, an amplifier circuit (not shown) may be coupled between the field detector and the computing system.

The field detector may be configured to detect the electric and/or magnetic fields of an operating circuit 115 or circuit board (e.g., printed circuit board or "PCB") 117 or the like. A circuit board as referred to herein may include a PCB with additional electronic components thereon or may include a PCB without additional electronic components thereon. For convenience, circuit and circuit boards are referred to herein collectively as circuits unless otherwise specified.

Figure 1B:
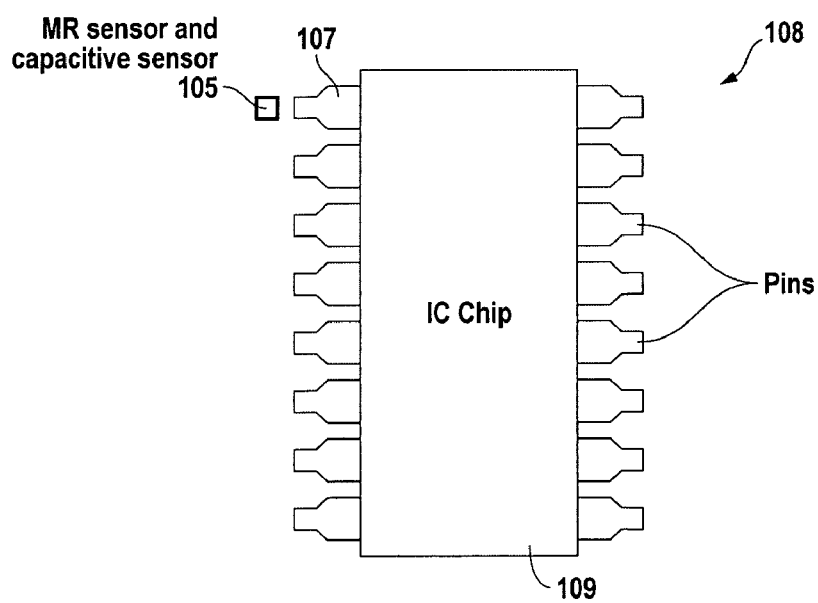
FIG. 1B is a simplified schematic of field detector disposed adjacent to a lead of an integrated circuit package.

FIG. 1B is a simplified schematic of field detector 105 disposed adjacent to a lead 107 (also sometimes referred to as a pin) of an integrated circuit package 108. While the field detector is shown adjacent to a lead, the field detector may be positioned adjacent to the body portion 109 of the IC package to detect electric and magnetic fields emanating therefrom.

According to one embodiment of the present invention, the field detector is mounted to a manual or automated probe for inspecting a circuit (e.g., a PCB and/or ICs or other circuits mounted thereon). The probe may be manually controlled by a manually controlled stage (discusses in further detail below) or computer controlled stage to translate the probe and field detector relative to a circuit.

Figure 1C:
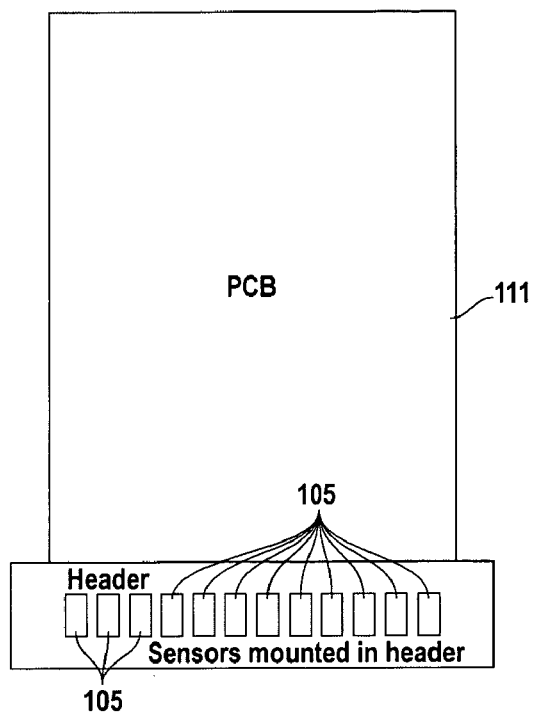
FIG. 1C is a simplified schematic of a field detector coupled to a circuit according to another embodiment of the present invention.

FIG. 1C is a simplified schematic of a set of field detectors 105 coupled to a circuit 111 (e.g., a PCB and/or other circuit). The field detectors may also be substantially permanently mounted to (e.g., inside) the circuit (e.g., a PCB, an IC, a wiring component or the like). Mounting the field detectors in a substantially permanent manner to the circuit provides that electric and magnetic fields generated from the circuit may be monitored for extended and substantially continuous periods. This embodiment provides substantially real-time inspection and test of the circuit for a relatively extended period. According to one embodiment, mounting the field detectors to the circuit provides that the circuit may be tested for a relatively long period to determine how the circuit ages (i.e., deteriorates). Data regarding age related failures may be used by circuit designers and the like to perform prognostics to predict a failure before it occurs thereby possibly preventing catastrophic failures during circuit operation.

Computing system 110 may be a personal computer, embedded computer, or the like and may include a memory with "gold-standard" information 120 and program code 125 for accepting and analyzing signals received from the field detector, which in some embodiment is a detector array. As will be will understood by those of skill in the art the gold-standard information and program code may be stored in memory. Gold-standard information includes information for a given circuit that is known to be operating correctly. The gold-standard information may include information that is comparable to signals received from the field detector or that is comparable to a transformed signal, such as a signal that is Fourier transformed, a signal that is otherwise integrated, a signal for which a derivative is calculated or otherwise mathematically transformed. A comparison by the computer system of gold-standard information to signal information (whether or not mathematically transformed) provides information whether a circuit is operating within or outside of acceptable operating parameters.

The computer memory may also include defect information, such as defect information for known defects of a given circuit. Defect information, similar to gold-standard information, may be compared to signals received from the field detector for identifying defects in circuits.

According to one embodiment of the present invention, field detector 105 includes a conductive plate where the conductive plate is one plate of a capacitor. The other plate of the capacitor may be part of the circuit under test, such as the pin on an IC, a trace, or a component lead. According to another embodiment of the present invention, the field detector includes a capacitor having two plates that are configured to be disposed around a circuit. The field detector may be configured to detect the electric field of a circuit under test. The field detector may also be configured to detect the magnetic field of a circuit under test and may be a magnetoresistive sensor (such as anisotropic magnetoresistive material (e.g., permalloy), giant magnetoresistive magnetic tunnel junction) or it may be another type of magnetic sensor. According to an alternative embodiment, the field detector may include discrete elements for detecting electric fields and magnetic fields. These discrete or combined detectors may be formed on a single substrate, such as a silicon substrate, a PCB, or the like.

According to one alternative embodiment, the field detector is an array of field detectors. According to yet another alternative embodiment, where the capacitive detector and the magnetic field detector are discrete detectors, one or both of the capacitive detector and the magnetic field detector are arrays of detectors.

A distributed array provides for detection of electric and magnetic fields over and extended area of a circuit. Therefore, a distributed array of detectors may be moved relative to a circuit fewer times than a discrete field detector to detects electric and magnetic fields from the same portion of the circuit. According to some embodiments, a distributed array may be sufficiently large such that the distributed array may not be moved to detect electric and magnetic fields to test a circuit.

According to one embodiment, the distributed array of field detectors is mounted on the surface of wiring (e.g., for a wiring harness application), or is embedded in a PCB or a PCB header when the PCB or the PCB header is manufactured. According to a further embodiment, the distributed array may be calibrated and operated independently of the circuit. Data from the distributed array may be monitored by a CPU running one or more circuit analysis programs to determine faults or aberrations from normal operating specifications. The CPU may be configured to log circuit information as the circuit is operated. The CPU may also be configured to identify circuit problems to a user as the problems occur in substantially real time. Identifying circuit problems in real time provides for relatively quick repair by providing the location and type of defect. The data collected can be analyzed to determine the effects of aging on the system and thus build a data base that may be used to predict failures based on the performance of the circuit components.

Further, a distributed array of field detectors mounted inside a circuit, such as a PCB or a card header, provides real time measurements for multiple circuit nodes while the circuit is installed and operational in a system in which the circuit is used. A distributed array of field detector may further provide time correlated data for a circuit which in-turn may provide information for circuit aging and for the performance of prognostics to predict defects, and more likely detection of intermittent defects that only occur during operation and are difficult to duplicate in the test lab. For example, a field detector mounted in a circuit (e.g., a PCB card) in a card cage called an LRU (line replaceable unit) mounted inside a LAV-25 (light armored vehicle) may provides real-time measurements of multiple circuit node for circuit analysis while limiting or eliminating a need for moving the distributed array.

According to one embodiment of the present invention, the field detector may have length "L" and width "W" dimensions of about 1-1000 microns and about 0.5-40 microns, respectively. The dimensions of the field detector might be different based, for example, on the dimension of the circuit feature for with an electric or a magnetic field is to be detected.

The field detector may be placed proximate (e.g., from approximately 1 to 100 microns) to a portion of a circuit under test so that the field detector can detect electric and magnetic fields from the circuit portion. For example, the field detector may be positioned proximate to a lead of a packaged integrated circuit (IC) to detect the electric field and the magnetic field from the lead when the lead is driven by the IC or an external drive source. The circuit may be driven with known electrical inputs that are configured to generate a known response in the circuit. The known response of the circuit may be associated with a known electric field and magnetic field response of the circuit. The known response may also be associated with performance specifications of the circuit.

A detected electric field, detected with the field detector, is associated with the voltage on the portion of the circuit generating the electric field. The detected electric field for a digital signal may be detected as voltage spikes, which are coincident with the switching of the digital signal from low to high or high to low. The detected electric field for an analog signal may be detected as voltages changing with time, which are coincident with the electrical signal at the measurement point at any time.

Figure 2:
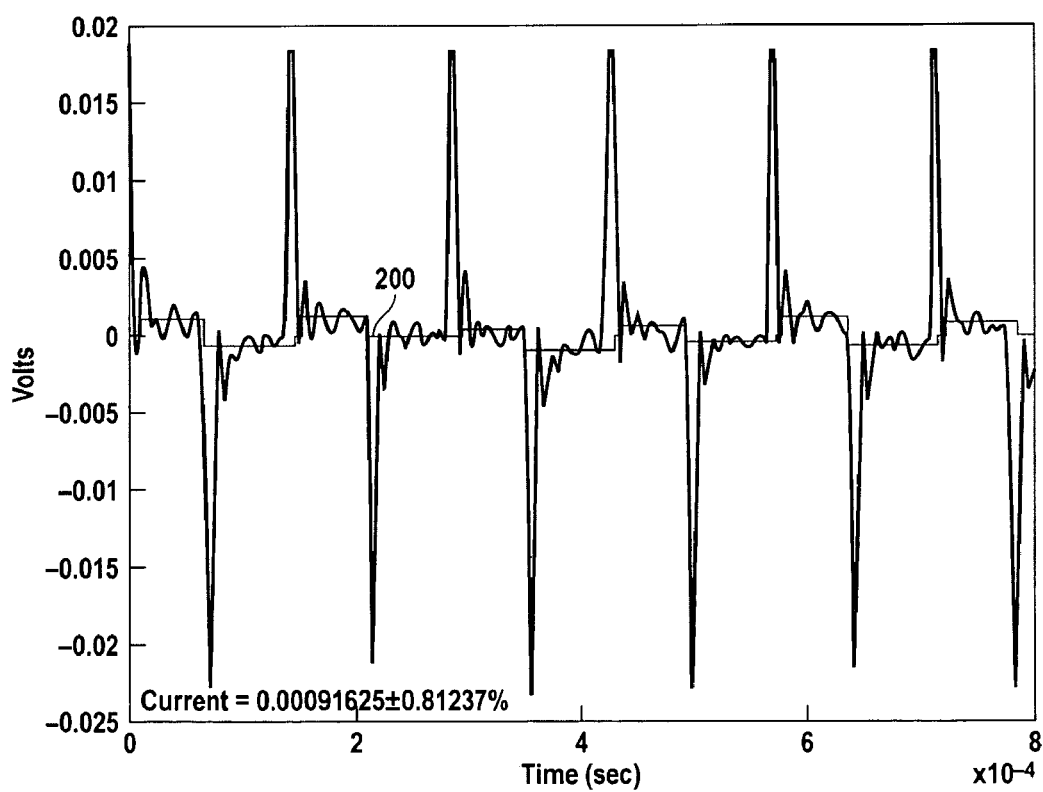
FIG. 2 is an exemplary schematic of voltage spikes detected by the field detector.

FIG. 2 is an exemplary schematic of voltage spikes 200 detected by the field detector. Each voltage spike is associated with a voltage transition in the circuit portion being tested. The voltage spikes are positive and negative respectively for low to high transitions and high to low transitions of voltages on the circuit portion being tested. Stated alternatively, the voltage spikes have the same sign as the differentiated pin signal. The voltage spike decays with an RC rate associated with the capacitance and resistance of the field detector and components coupled thereto. The measured amplitude of the voltage spikes detected by the field detector are proportional to the voltages on the tested component of the circuit. As experimentally determined, the measured voltage spikes vary linearly with the voltage on the tested circuit portion.

Figure 3:
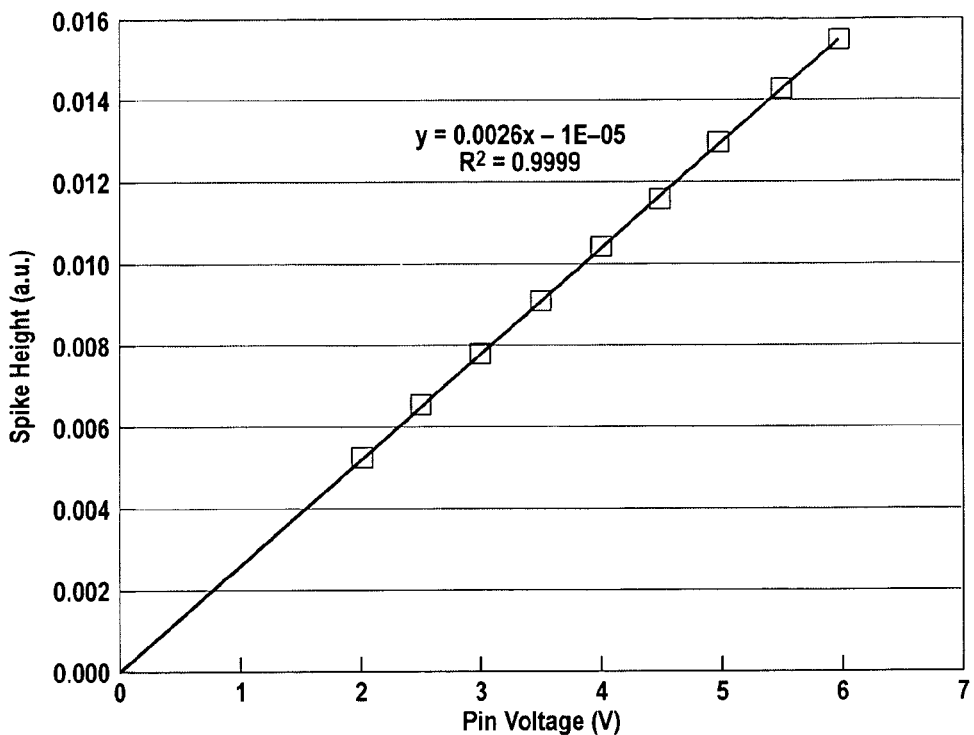
FIG. 3 is a simplified schematic of voltage spike heights detected by the field detector and shows the linear proportionality of these voltage spikes to the actual voltage on a tested circuit portion.

FIG. 3 is a simplified schematic of voltage spike heights detected by the field detector and shows the linear proportionality of these voltage spikes to the actual voltage on a tested circuit portion. Typically the measured voltage spikes on the field detector are 100-1000 times smaller than the actual voltage on the tested circuit portion and drop off with the distance of the field detector from the circuit portion. The proportionality of the voltage spikes to the actual voltages on a circuit portion being detected may be calibrated for various configurations of the field detector and the circuit portion. For example, the proportionality between the measured voltage spikes and the actual voltage may be calibrated based on a given distance between the field detector and the circuit portion. The calibration information along with the gold-standard information may be used by the computer system during the testing of a circuit to determine the actual voltage on a circuit portion being tested, and thereby determine whether the circuit is operating at acceptable voltage levels. The computer system may be configured to indicate to a user (e.g., human user or another computer system) whether the circuit is operating within the acceptable voltage levels.

According to one embodiment, the electric field detected from the voltage on a circuit portion is measured over a given time period. Therefore, the operating frequency and pulse width of the signals in the circuit may be determined. The signal characteristics may be compared by the computer system to gold-standard information for each characteristic to determine whether the circuit is operating within acceptable parameters. The computer system may be configured to indicate to the user whether or not the circuit is operating within the acceptable frequency range.

According to a further embodiment, the magnetic field detected by the field detector is coincident with and follows the voltage spike detected by the field detector. The detected magnetic field is approximately a square wave and has a similar shape and duration to the voltage on the circuit portion being tested. FIG. 2 has a line 200 superimposed on the signals detected by the field detector to show the mean of the detected magnetic field. Line 200 is approximately a square wave as discussed above. The height of the square wave is proportional to the current in the circuit portion being tested. As experimentally determined, the height of the square wave for the detected magnetic field varies linearly with the current in the circuit portion being tested.

Figure 4:
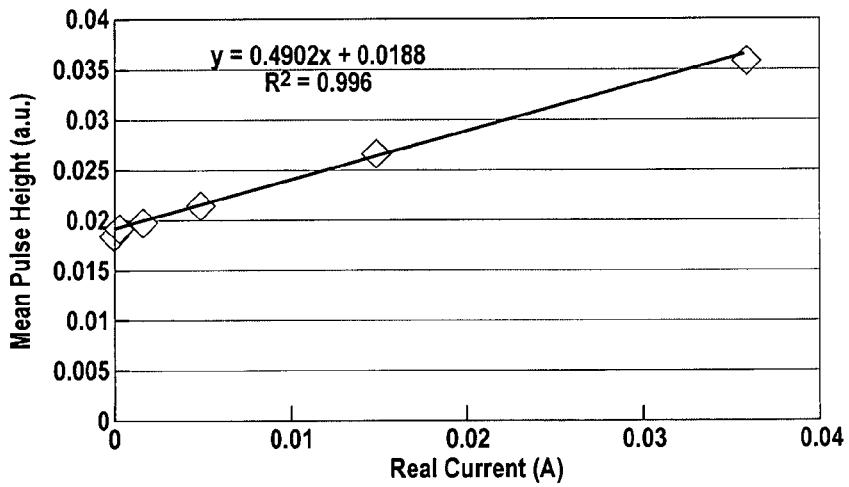
FIG. 4 is an exemplary graph of the mean pulse height for a detected magnetic field versus the real current in a circuit portion being tested.

FIG. 4 is an exemplary graph of the mean pulse height for a detected magnetic field versus the real current in a circuit portion being tested. The graph shows the experimentally determined linear relationship between the mean pulse height and the real current. According to one embodiment, the mean pulse height can be calibrated to the real current for various geometries of (e.g., distance between) the field detector and circuit portion being tested. The calibration information along with the gold-standard information may be used by the computer system for testing the circuit to determine whether the circuit is operating within an acceptable current range. The computer system may be configured to indicate to the user whether or not the circuit is operating within the acceptable current range.

The computer system may be configured to store the collected voltage, frequency, and/or current information for tested circuits for further analysis, such as for statistical analysis of a group of circuits or to develop a database of information on circuit performance and faults. The computer system may also be configured to generate various graphs of the voltage, current, and frequency. For example, the computer may be configured to generate I/V curves where current and voltage are mapped along different axes of the graph. Such I/V curves are well understood by those of skill in the art and will not be explained in detail herein.

According to one embodiment, the collected current information, operating frequency information, and/or the detected operating voltage of a circuit may be used by the computer system to relatively quickly to determine whether a circuit is operating within acceptable operating parameters. The circuit may be stimulated by various known inputs according to a test protocol that is run by a test program, which runs on the computer system. The collected current information, operating frequency information, and/or the detected operating voltage may be used in conjunction with the test program to determine subsequent inputs to the circuit. The voltage, current, and/or operating frequency of the circuit in response to the subsequent inputs may also be detected and tested to further determine whether the circuit is operating properly. This feedback method may be executed for a number of circuit operation cycles to test the circuit.

Figure 5:
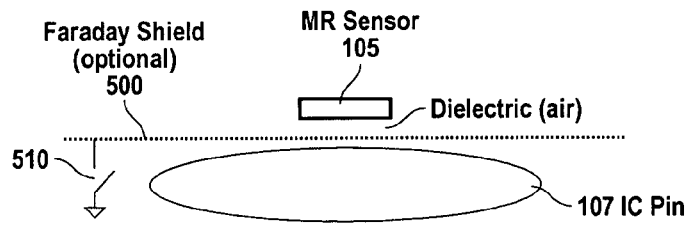
FIG. 5 is a simplified schematic of the field detector and the circuit wherein a conductive shield is positioned between the field detector and the circuit.

The signals for the electric field and the magnetic field may be separated for simplified analysis of a circuit. According to one embodiment of the present invention, a conductive shield is positioned between the field detector and the circuit. FIG. 5 is a simplified schematic of the field detector and the circuit wherein a conductive shield 500 is positioned between the field detector and the circuit. According to a specific embodiment, the shield may be configured to substantially surround the field detector and to be physically coupled to the field detector, while not being electrically coupled to the field detector. Similarly a high permeability material could be used to block the magnetic field from reaching the sensor. High permeability material may be used in one embodiment to shield the field sensor from an external magnetic field, which are not generated by the circuit. The high permeability material may be moved to shield and not shield the field sensor to calibrate the field detector by determining the effect of the external magnetic field on the field sensor.

The shield may be grounded to inhibit the electric field from penetrating the shield while permitting the magnetic field to penetrate the shield. According to a specific embodiment, the ground may be coupled to a switch 510 that is configured to alternately couple and decouple the shield to ground. The shield may be decoupled from ground as the voltage in the circuit switches so that the field detector can detect this transition and generate the voltage spikes associated therewith (discussed in detail above). The shield may be grounded thereafter by the switch so that the any electric field generated by the transitioning circuit portion is blocked by the shield and the magnetic field generated by the circuit portion may be detected by the field detector. The switch may be turned on and off in accordance with known test parameters to detect voltage, current, and operating frequency for the circuit. This switching of the switch may be controlled by the test program operating on the computer system.

The shield may be non-ferromagnetic (e.g., copper or aluminum) and is often referred to as a Faraday shield. The thickness of the shield may be less than the skin depth at the frequency of interest. For a copper shield, for example, the shield might be greater than about 2.5 mils (i.e., greater than about 63 millimeters) thick. The skin depth for a 2.5 mil thick copper shield is over 1 megahertz.

Figure 6:
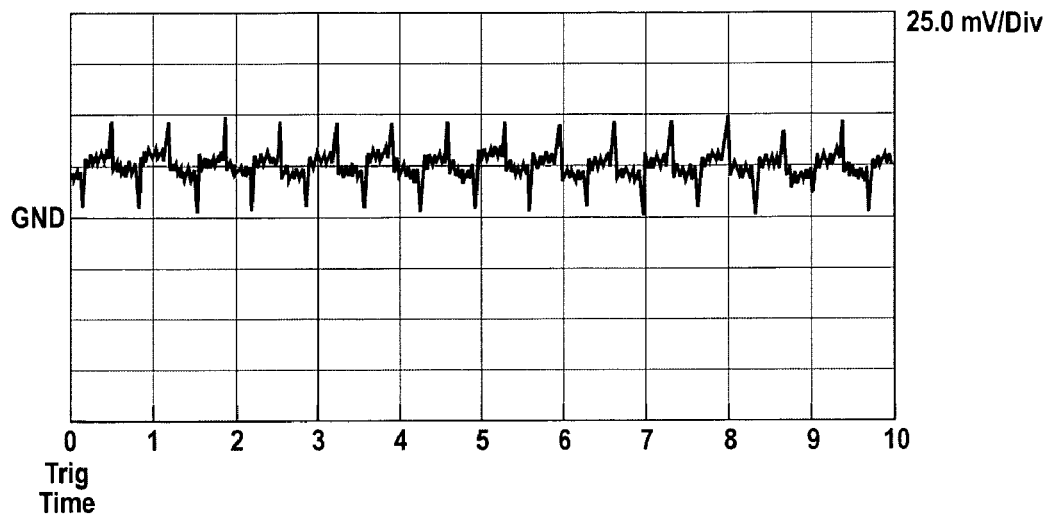
FIGS. 6 and 7 are exemplary schematics of separated voltage spikes (FIG. 6) from a detected electric field of a switching circuit and a square wave (FIG. 7) from a detected magnetic field.
Figure 7:
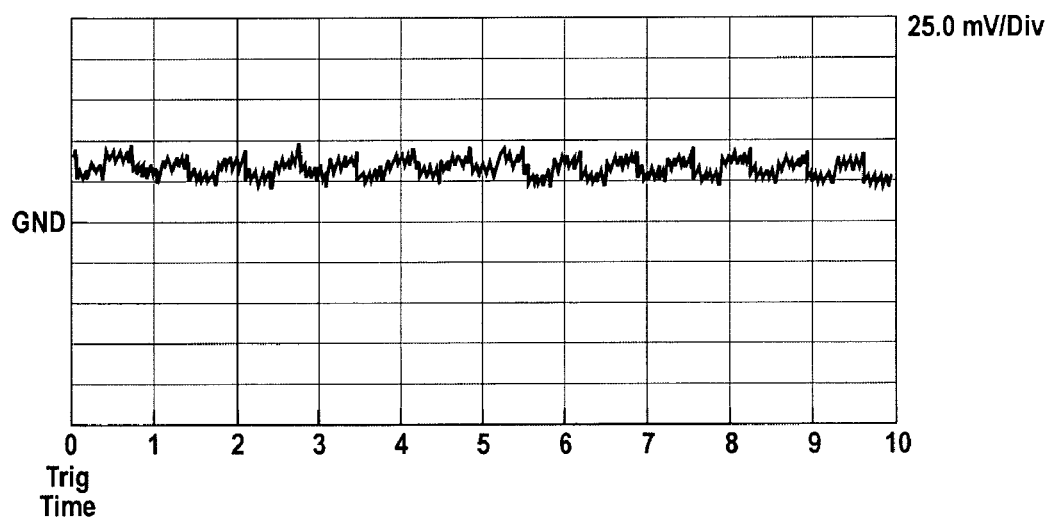

FIGS. 6 and 7 are exemplary schematics of separated voltage spikes (FIG. 6) from a detected electric field of a switching circuit and a square wave (FIG. 7) from a detected magnetic field. According to the exemplary embodiment shown in FIGS. 6 and 7, the detected electric and magnetic field were separated with a grounded copper shield (described above).

Figure 8:
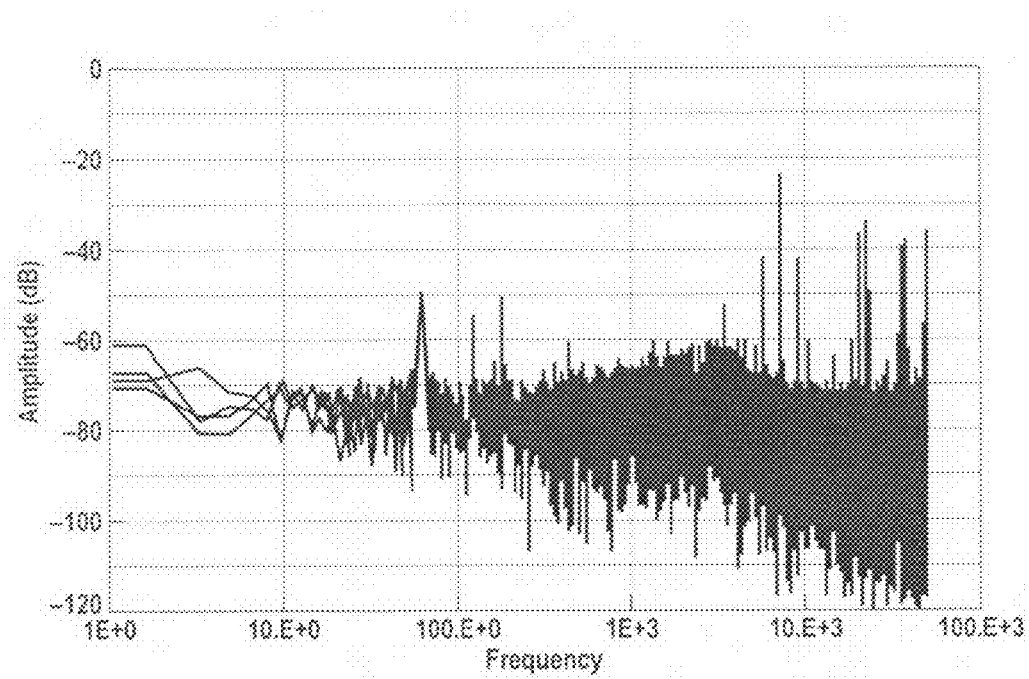
FIGS. 8 and 9 are exemplary graphs of Fourier transformed signals detected by the field detector
Figure 9:
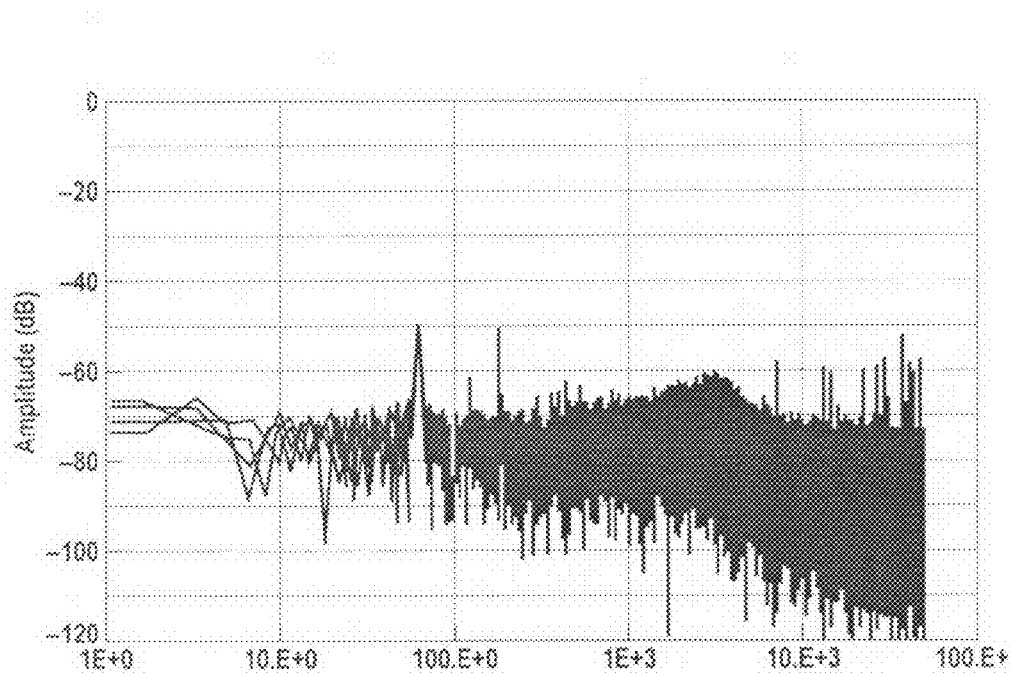

According to another embodiment, the voltage information from the detected electric field and the current information from the detected magnetic field may be separated by computing the difference in frequency space from the results of a Fourier transform of the voltage spikes and the square wave. The harmonics in frequency space are different for the voltage spikes and the square waves. The difference in harmonics may be further enhanced by alternately grounding and un-rounding the conductive shield discussed above where the shield is configured to inhibit the electric field from reaching the field detector. FIGS. 8 and 9 are exemplary graphs of Fourier transformed signals detected by the field detector. FIG. 8 is a Fourier transform of the combined electric and magnetic field signals collected by the field detector. FIG. 9 is a Fourier transform of the magnetic field signals collected by the field detector (e.g., with the field detector shielded with the conductive shield). It is particularly noted that there are differences in the amplitude and the frequency components (e.g., in the kilohertz range) of the transformed signals.

According to another embodiment, the voltage information from the detected electric field and the current information from the detected magnetic field may be separated by sampling the electric field and magnetic field at different times. For example, the electric field may be sampled at a time interval surrounding a voltage transition in the circuit and the magnetic field may be sampled thereafter.

Figure 10:
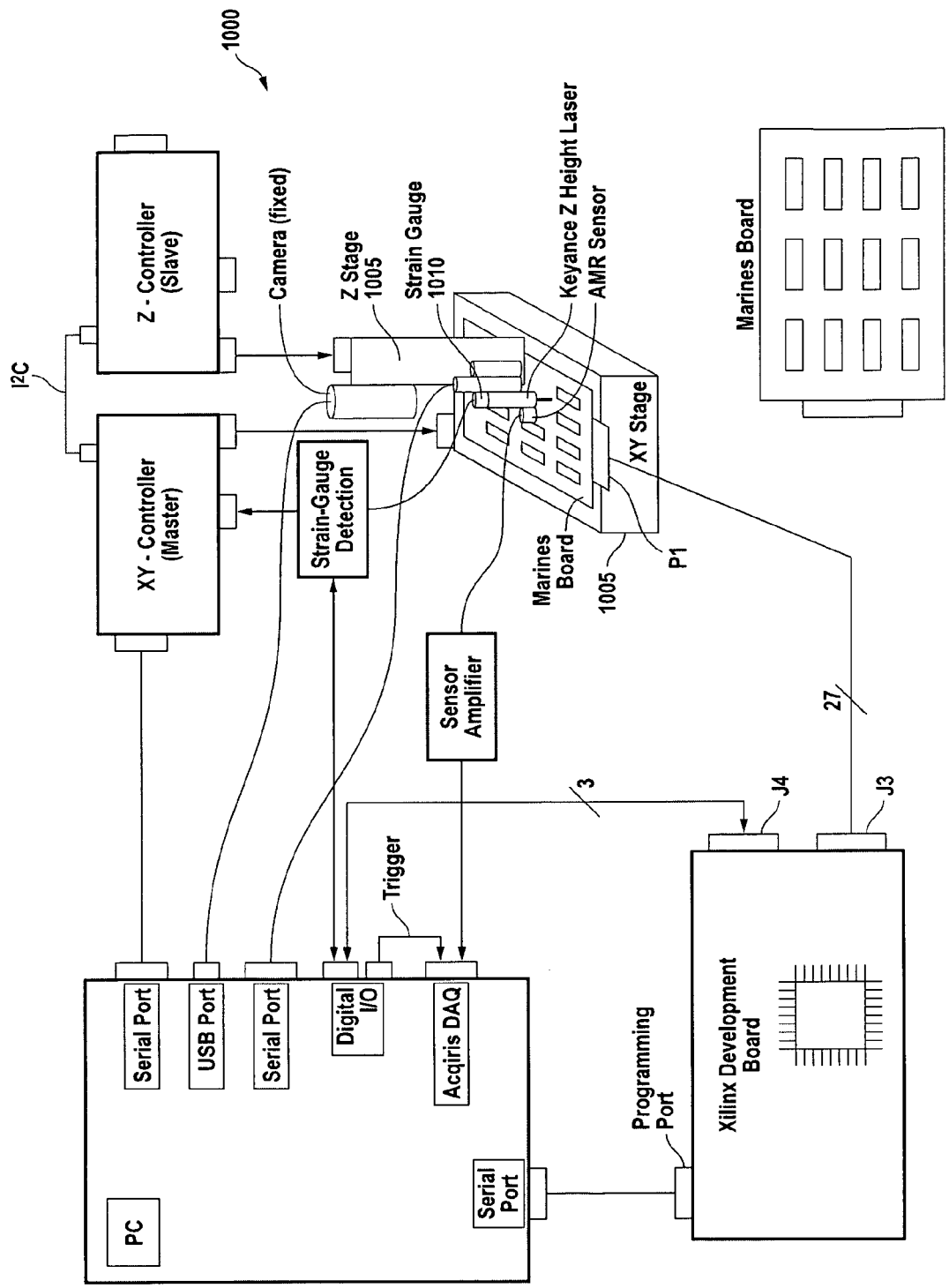
FIG. 10 is a simplified schematic of a test system according to another embodiment of the present invention.

FIG. 10 is a simplified schematic of a test system 1000 according to another embodiment of the present invention.

Test system 1000 includes a stage 1005 that is configured to move the circuit under test relative to the field detector. The stage may be an XYZ stage configured to move the circuit in three dimensions. The stage may be computer controlled to automate movement of the circuit relative to the field detector to test various portions of the circuit. Movement of the stage may be controlled by the test program operating on the computer system so that various anticipated signals from the circuit may be tested. The stage may be powered by a Velmex, Inc. stepper motor or the like. The Velmex, Inc. stepper motor may be configured to move the circuit by steps a small as 1.25 microns. The stage may include various devices that permit the circuit to be rotated in one or more angular directions to permit the field detector to be positioned proximate to the circuit as desired. According to an alternative embodiment, the stage may be coupled to the field detector. According to yet another alternative, the Z-stage may be coupled to the field detector and the XY stage may be coupled to the circuit. The circuit and/or the field detector might also be coupled to a rotation stage that is configured to rotate the circuit and/or field detector relative to one another in one or more angular directions.

According to one embodiment, the computer system may be configured to store the collected voltage, frequency, and/or current information for various points on a circuit using the x, y, and/or z position of the stage to correlate the collected information to the points.

The computer system may then be configured using the correlated information to generate a map of the collected magnetic and/or electric fields generated by an operational circuit. The computer system may also be configured to generate a map of the voltage, frequency, and/or current information. The generated maps may be grayscale maps, color maps, number maps, or the like to indicate the intended information.

Test system 1000 might also include a strain gauge 1010, which is coupled to the field detector. The strain gauge may be configured to detect the strain on the field detector, for example, as the field detector or circuit are translated relative to one another and as the field detector is moved into contact with the circuit. The strain gauge may be configured to send commands substantially directly to the steppers motors of the stage to stop them from moving the field detector into the circuit with a force great enough to damage the field detector.

Test system 1000 further includes a proximity sensor 1015 configured to detect the height and lateral distance between the field detector and the circuit. This sensor may be an optical system, such as a laser metrology sensor. Similarly, an ultrasonic ranging sensor may be used for this purpose. Test system 1000 may also include a camera 1020, such as a visual light movie camera or an infrared camera. The camera may be coupled to the computing system (described above) and may be configured to interact with the computing system to perform optical recognition and other relevant measurements on the circuit. For example, if the circuit is a PCB with a number of ICs thereon, the camera and computing system may be configured to recognize specific ICs and the like on the PCB to aid in guiding the field detector to a particular IC that is to be tested by the test system. According to a specific embodiment, the camera is a Dino-Lite Digital Microscope manufactured by Sotac Computer GmbH of Stuttgart Germany. The camera might have a magnification of up to approximately 200× and might have a frame capture rate of up to 30 Hz or greater.

Figure 11:
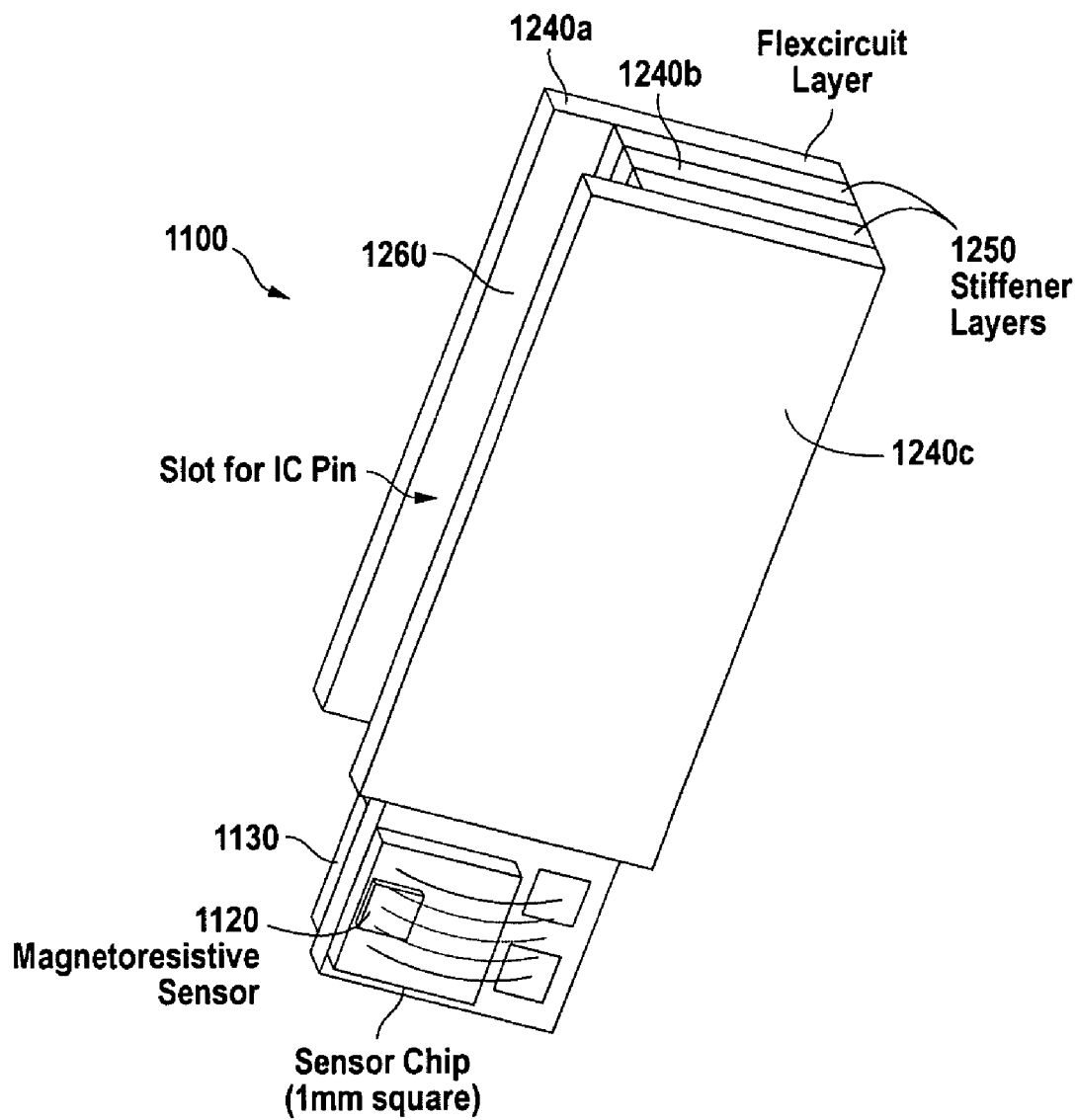
FIG. 11 is a simplified schematic of a field detector according to a specific embodiment of the present invention.

FIG. 11 is a simplified schematic of a field detector 1100 according to a specific embodiment of the present invention. The field detector 1100 includes a first MR sensor 1120 and may include a second MR sensor 1130. Two MR sensors disposed on opposite sides of the field detector provide for differential measurements that lower the effect of extraneous magnetic fields detected by the detector.

Field detector 1100 further includes a set of flexible layers 1140 coupled to a set of stiffening layers 1150 where the flexible layers and the stiffening layers are respectively interleaved with one another. The flexible layers may extend beyond the stiffening layers to form a channel 1160. Channel 1160 may have a width that substantially matches the width of a pin of an IC package. The channel may be moved "onto" the IC pin via the stage. The field detector may be coupled to the stage via a spring mount (not shown) where the spring permits the field detector to move slightly so that the channel can mount to the pin without damaging the pin if, for example, the channel is slightly unaligned to the pin. A spring mount further provides that the field detector can be substantially consistently mounted on an IC pin so that the distance of the field detector to the IC pin is substantially consistent. Substantially consistently mounting the field detector to an IC pin provides that the MR sensors may be placed in relatively close proximity to the IC pin where the detected fields are relatively strong.

According to one embodiment, a flex detector (e.g., a switch, not shown) is coupled to the set of flexible layers 1140 and/or the set of stiffening layers 1150. The flex detector is configured to detect an amount of flex in the set of flexible layers and/or the stiffening layers. The flex detector may be coupled to the computer system, which may be configured to use signals from the flex detector stop movement of the field detector at a relatively precise position as the field detector is brought into relatively close proximity with a point of measurement of a circuit.

It is to be understood that the examples and embodiments described above are for illustrative purposes only and that various modifications or changes in light thereof will be suggested to persons skilled in the art and are to be included within the spirit and purview of this application and scope of the appended claims. Therefore, the above description should not be understood as limiting the scope of the invention as defined by the claims.

What is claimed is:

1. A non-contact circuit analyzer comprising:
 a computer system having a memory with circuit parameters stored therein wherein the circuit parameters specify acceptable operating characteristics for a circuit;
 a magnetic field sensor coupled to the computer and configured to detect the magnetic field emitted from the circuit while operational, wherein the magnetic field relates to current in the circuit;
 an electric field sensor coupled to the computer and configured to detect the electric field emitted from the circuit while operational, wherein the electric field relates to voltage and/or operating frequency in the circuit;
 wherein the magnetic field sensor and the electric field sensor are configured to send signals for the detected fields to the computer system, and
 wherein the computer system is configured to:
  compare the signals to the circuit parameters to determine whether the circuit is operating within the circuit parameters,
  Fourier transform the signals to separate the electric field information from the magnetic field information,
  identify a first set of harmonics associated with detected electric field spikes associated with voltage transitions in the circuit, identify a second set of harmonics associated with a substantially square wave associated with the detected magnetic fields and the current in the circuit, compare the first and second sets of harmonics with the circuit parameters, and based on the comparison determine the performance of the circuit with respect to a standard circuit from which the circuit parameters are collected while the standard circuit is operational.

2. The non-contact circuit analyzer of claim 1, wherein the magnetic field sensor comprises a monolithic sensor array.

3. The non-contact circuit analyzer of claim 1, wherein the magnetic field sensor comprises a distributed sensor array.

4. The non-contact circuit analyzer of claim 1, wherein the magnetic field and electric field sensors comprise separate sensors.

5. The non-contact circuit analyzer of claim 1, wherein the electric field sensor includes at least one conductive member of a capacitive sensor.

6. The non-contact circuit analyzer of claim 5, wherein the circuit is another conductive member of the capacitive sensor.

7. The non-contact circuit analyzer of claim 1, wherein the computer system is configured to execute program code to operate the circuit in a known sequence of operations.

8. The non-contact circuit analyzer of claim 1, wherein the computer system is configured to direct operation of the circuit based on the signals received from the electric and magnetic field sensors.

9. The non-contact circuit analyzer of claim 1, wherein the computer system is configured to generate an IN curve for the circuit.

10. The non-contact circuit analyzer of claim 1, wherein the computer system is configured to generate a map of the detected electric and/or magnetic fields.

11. The non-contact circuit analyzer of claim 1, wherein the electric field sensor and the magnetic field sensor are a single sensor.

12. The non-contact circuit analyzer of claim 11, wherein the single sensor is a magnetoresistive sensor.

13. The non-contact circuit analyzer of claim 1, wherein the electric field sensor and the magnetic field sensor are an array of sensors, and wherein each sensor in the array of sensors is a magnetoresistive sensor.

14. The non-contact analyzer of claim 13, wherein the array of sensors is configured to be mounted to the circuit, and wherein the array of sensors is configured to detect electric and magnetic fields from the circuit in real time for age analysis of the circuit and circuit prognostics.

15. The non-contact circuit analyzer of claim 1, wherein the electric field signals and the magnetic field signals are identified by sampling the detected fields at different times during an operating cycle of the circuit.

16. The non-contact analyzer of claim 1 further comprising:
a conductive shield disposed between the field sensor and the circuit; and
a switch configured to periodically ground the shield;
wherein the shield in a grounded state is configured to inhibit the circuit's electric field from reaching the electric field sensor and permit the circuit's magnetic field to reach the magnetic field sensor.

17. The non-contact analyzer of claim 1 further comprising:
a high permeability magnetic shield disposed between the circuit and the field sensor.

18. The non-contact analyzer of claim 17, wherein the high permeability magnet shield is configured to shield external magnetic fields from reaching the field sensor.

19. The non-contact circuit analyzer of claim 1 wherein the magnetic field sensor and the electric field sensor are a monolithic sensor array comprising a giant magnetoresistance (GMR) sensor or an anisotropic magnetoresistance (AMR) sensor.

20. A non-contact circuit analyzer comprising:
a computer system having a memory configured to store circuit parameters, wherein the circuit parameters specify acceptable operating characteristics for a circuit obtained by testing of a standard circuit;
a magnetoresistive sensor coupled to the computer and configured to detect substantially simultaneously electric fields and magnetic fields emitted from the circuit while operational, wherein:
the magnetoresistive sensor is configured to send signals for the electric fields and the magnetic fields to the computer system, and the computer system is configured to compare the signals for the circuit to the circuit parameters for the standard circuit and determine whether the circuit is operating substantially within a range of the circuit parameters.

21. A non-contact circuit analyzer comprising:
a computer system having a memory with circuit parameters stored therein wherein the circuit parameters specify acceptable operating characteristics for a circuit;
a magnetic field sensor coupled to the computer and configured to detect the magnetic field emitted from the circuit while operational, wherein the magnetic field relates to current in the circuit;
an electric field sensor coupled to the computer and configured to detect the electric field emitted from the circuit while operational, wherein the electric field relates to voltage and/or operating frequency in the circuit;
a conductive shield disposed between the field sensor and the circuit; and
a switch configured to periodically ground the shield,
wherein the shield in a grounded state is configured to inhibit the circuit's electric field from reaching the electric field sensor and the magnetic field sensor and permit the circuit's magnetic field to reach the electric field sensor and the magnetic field sensor, and
wherein the magnetic field sensor and the electric field sensor are configured to send signals for the detected fields to the computer system, and the computer system is configured to compare the signals to the circuit parameters to determine whether the circuit is operating within the circuit parameters.

22. The non-contact circuit analyzer of claim 21 wherein the magnetic field sensor and the electric field sensor are a monolithic sensor array comprising a giant magnetoresistance (GMR) sensor and an anisotropic magnetoresistance (AMR) sensor.

* * * * *